(12) United States Patent
Huang et al.

(10) Patent No.: US 9,047,974 B2
(45) Date of Patent: Jun. 2, 2015

(54) ERASED STATE READING

(71) Applicant: SanDisk Technologies Inc., Plano, TX (US)

(72) Inventors: Jianmin Huang, San Carlos, CA (US); Zhenming Zhou, San Jose, CA (US); Gautam Ashok Dusija, Milpitas, CA (US); Chris Nga Yee Avila, Saratoga, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 89 days.

(21) Appl. No.: 13/783,068

(22) Filed: Mar. 1, 2013

(65) Prior Publication Data

US 2014/0098610 A1 Apr. 10, 2014

Related U.S. Application Data

(60) Provisional application No. 61/709,880, filed on Oct. 4, 2012.

(51) Int. Cl.
*G11C 11/34* (2006.01)
*G11C 16/34* (2006.01)
*G11C 16/26* (2006.01)

(52) U.S. Cl.
CPC ............ *G11C 16/3459* (2013.01); *G11C 16/26* (2013.01)

(58) Field of Classification Search
USPC ............. 365/185.03, 185.12, 185.17, 185.18, 365/185.24, 185.29, 185.33
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,057,939 | B2 | 6/2006 | Li et al. |
| 7,304,893 | B1 | 12/2007 | Hemink |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Trong Phan
(74) *Attorney, Agent, or Firm* — Davis Wright Tremaine LLP

(57) ABSTRACT

A method of determining whether a page of NAND flash memory cells is in an erased condition includes applying a first set of read conditions to identify a first number of cells having threshold voltages above a discrimination voltage under the first set of read conditions, if the first number of cells is less than a first predetermined number, applying a second set of read conditions that is different from the first set of read conditions to identify a second number of cells having threshold voltages above the discrimination voltage under the second set of read conditions, and if the second number of cells exceeds a second predetermined number, marking the page of flash memory cells as partially programmed.

9 Claims, 10 Drawing Sheets

(56) References Cited

U.S. PATENT DOCUMENTS

| | | |
|---|---|---|
| 7,764,544 B2 | 7/2010 | Mokhlesi |
| 8,099,652 B1 | 1/2012 | Alrod et al. |
| 8,484,533 B2 | 7/2013 | Olbrich et al. |
| 8,730,724 B2 * | 5/2014 | Kuo et al. ................. 365/185.03 |
| 8,737,125 B2 * | 5/2014 | Pan et al. ................. 365/185.03 |
| 2006/0171210 A1 | 8/2006 | Nagashima et al. |
| 2009/0059670 A1 | 3/2009 | Maejima et al. |
| 2010/0128525 A1 | 5/2010 | Mokhlesi |
| 2010/0165748 A1 | 7/2010 | Thiruvengadam et al. |
| 2011/0134697 A1 | 6/2011 | Zhao et al. |
| 2012/0008389 A1 | 1/2012 | Kim |
| 2012/0220088 A1 | 8/2012 | Alsmeier |
| 2012/0243328 A1 | 9/2012 | Tatebe et al. |

OTHER PUBLICATIONS

Technical Search Report by Patent Examiner Fredrik Wahlin, Nov. 20, 2012, 7 pages.

* cited by examiner

Programming into four states represented by a 2-bit code

Lower Page Programming (2-bit Code)

Upper Page Programming (2-bit Code)

Lower Page Read (2-bit Code)

Upper Page Read (2-bit Code)

| | Normal Read Conditions | Negative V_TH Read Conditions |
|---|---|---|
| WLn+2 | Vpass | Vpass |
| WLn+1 | Vpass | Vpass-Vdelta |
| WLn | $D_A$ or 0v | $D_A$ or 0v |
| WLn-1 | Vpass | Vpass |
| WLn-2 | Vpass | Vpass |

ERASED STATE READING

This application claims the benefit of U.S. Provisional Patent Application No. 61/709,880, filed on Oct. 4, 2012, which is hereby incorporated by reference in its entirety.

BACKGROUND

This application relates to the operation of re-programmable non-volatile memory systems such as semiconductor flash memory that can store one or more bits per cell by writing multiple states, and more specifically, to reading cells that are in an erased condition to determine if their threshold voltages correspond to an erased condition, or if their threshold voltages are higher than a threshold voltage for an erased cell.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

When a page is being programmed from an erased condition during a write operation, some event may cause the write operation to be aborted before all memory cells have reached their target states. Such cells may be in intermediate states that do not reflect any logical state, or may reflect the wrong logical state. In some cases, the memory system may not know that such a write abort has occurred because the page is not indicated as written (because writing was not complete). Pages affected by such write aborts may be problematic if they are not identified.

SUMMARY

In some memory arrays that use charge storage, memory cells that appear to be erased may be partially programmed, for example, as a result of a write abort occurring at an early stage of programming. Such partial programming may not be detected by a conventional read because threshold voltages of cells have not increased beyond a discrimination voltage used for a conventional read (e.g. zero volts). Where partial programming is suspected, a conventional read may be used first and, if the conventional read does not indicate partial programming, a second read may be performed using different read conditions that are selected for erase verification. By using a lowered pass voltage (compared with a conventional read) on at least one word line that is immediately adjacent to the selected word line, this read may detect memory cells that have some partial programming, even where the partial programming is insufficient to increase their threshold voltages above zero under conventional read conditions. Such checking may be selectively applied at start up or at other times when there is a risk of partial programming of memory cells that are indicated to be erased.

An example of a method of determining whether a page of NAND flash memory cells is in an erased condition includes: applying a first set of read conditions to identify a first number of cells having threshold voltages above a discrimination voltage under the first set of read conditions; if the first number of cells is less than a first predetermined number, applying a second set of read conditions that is different from the first set of read conditions to identify a second number of cells having threshold voltages above the discrimination voltage under the second set of read conditions; and if the second number of cells exceeds a second predetermined number, marking the page of flash memory cells as partially programmed.

The first set of read conditions may include a uniform word line bias to all unselected word lines in a block containing the page of NAND flash memory cells. The second set of read conditions may include applying a reduced word line bias to an unselected word line adjacent to the selected word line, and applying the uniform word line bias to all other unselected word lines in the block. All cells along the unselected word line adjacent to the selected word line may be unwritten cells. The uniform word line bias of the first set of read conditions may be 8-10 volts and the reduced word line bias to the unselected word line in the second set of read conditions may be less than 5 volts. The discrimination voltage may be 0 volts and the discrimination voltage may be applied to the selected word line. The second set of read conditions may include applying a reduced word line bias to two unselected word lines that are adjacent to the selected word line on either side, and applying the uniform word line bias to all other unselected word lines in the block. The second set of read conditions may include applying a reduced word line bias to three or more unselected word lines while applying the uniform word line bias to all other unselected word lines in the block. If the first number of cells is greater than the first predetermined number, the page of flash memory may be marked as partially programmed.

An example of a method of managing NAND flash memory may include: identifying a plurality of memory cells as likely partially-written memory cells; in response to identifying the plurality of memory cells as likely partially-written memory cells, applying a set of erase-verify conditions that is different from any data-read conditions to identify a number of cells having threshold voltages above a discrimination voltage under the erase-verify read conditions; and if the second number of cells exceeds a second predetermined number, marking the plurality of memory cells as partially programmed.

The set of erase-verify conditions may include a reduced voltage applied to an unselected word line adjacent to a selected word line, the reduced voltage being less than any voltage applied to an unselected word line of the data-read conditions. The plurality of memory cells may be identified as likely partially-written during a power-up routine. The plurality of memory cells may be identified as likely partially-written because of a write pointer that indicates that the plurality of memory cells are next in a sequence of writing memory cells of a block. In response to marking the plurality of memory cells as partially programmed, an erase operation may be performed on the plurality of memory cells prior to storage of any data in the plurality of memory cells.

An example of a NAND flash memory includes: a plurality of charge-storage memory cells forming a plurality of NAND strings; a plurality of word lines extending across the plurality of NAND strings, an individual word line forming control gates of memory cells of the plurality of NAND strings; and a word line decoder that, in a first mode, applies a first read-pass voltage to all unselected word lines in a block and, in a second mode, applies a second read-pass voltage to an unselected word line adjacent to the selected word line while applying the first read-pass voltage to other unselected word lines of the block, the second read-pass voltage being lower than the first read-pass voltage.

The second mode may be an erase-verification mode that determines whether memory cells are in the erased state. The second mode may be initiated in response to an indication that memory cells that are indicated to be erased may have been partially programmed as a result of an aborted write operation. The first read-pass voltage may be between 8 and 10 volts, and the second read-pass voltage is less than 5 volts.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

DETAILED DESCRIPTION

Memory System

Figure 1:
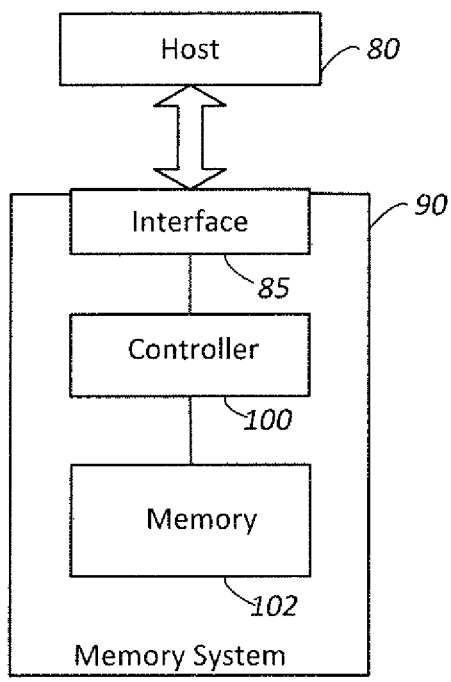
FIG. 1 shows a flash memory system connected to a host.

FIG. 1 illustrates schematically the main hardware components of a memory system suitable for implementing the present invention. The memory system 90 typically operates with a host 80 through a host interface 85. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. Each memory chip may additionally include peripheral circuits such as word line (row) decoder circuits and bit line (column) decoder circuits. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
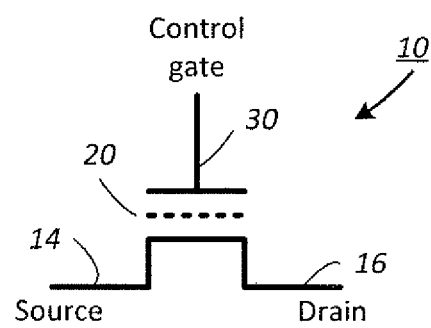
FIG. 2 illustrates a flash memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
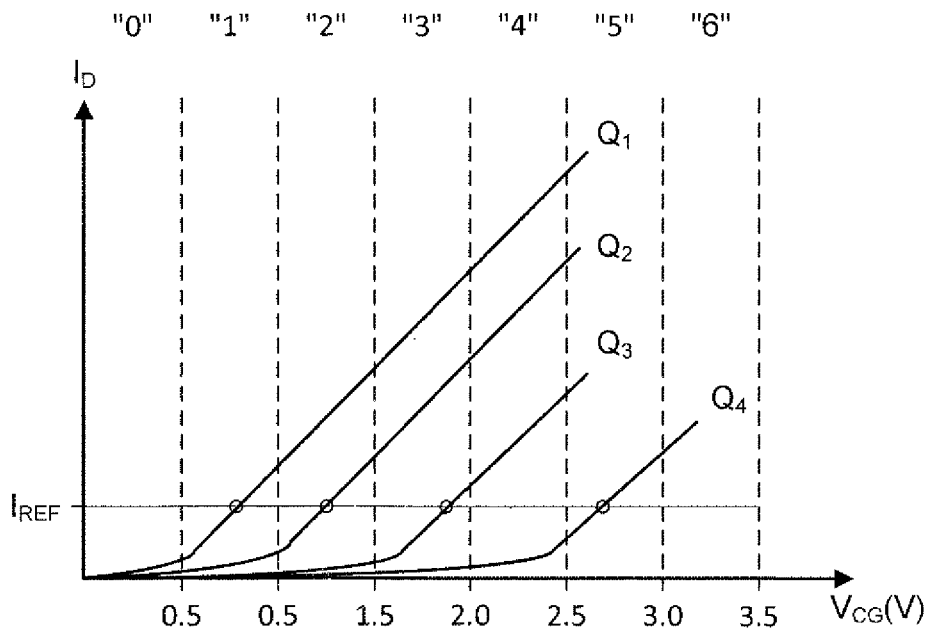
FIG. 3 illustrates charge storage in a flash memory cell.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", respectively and one erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
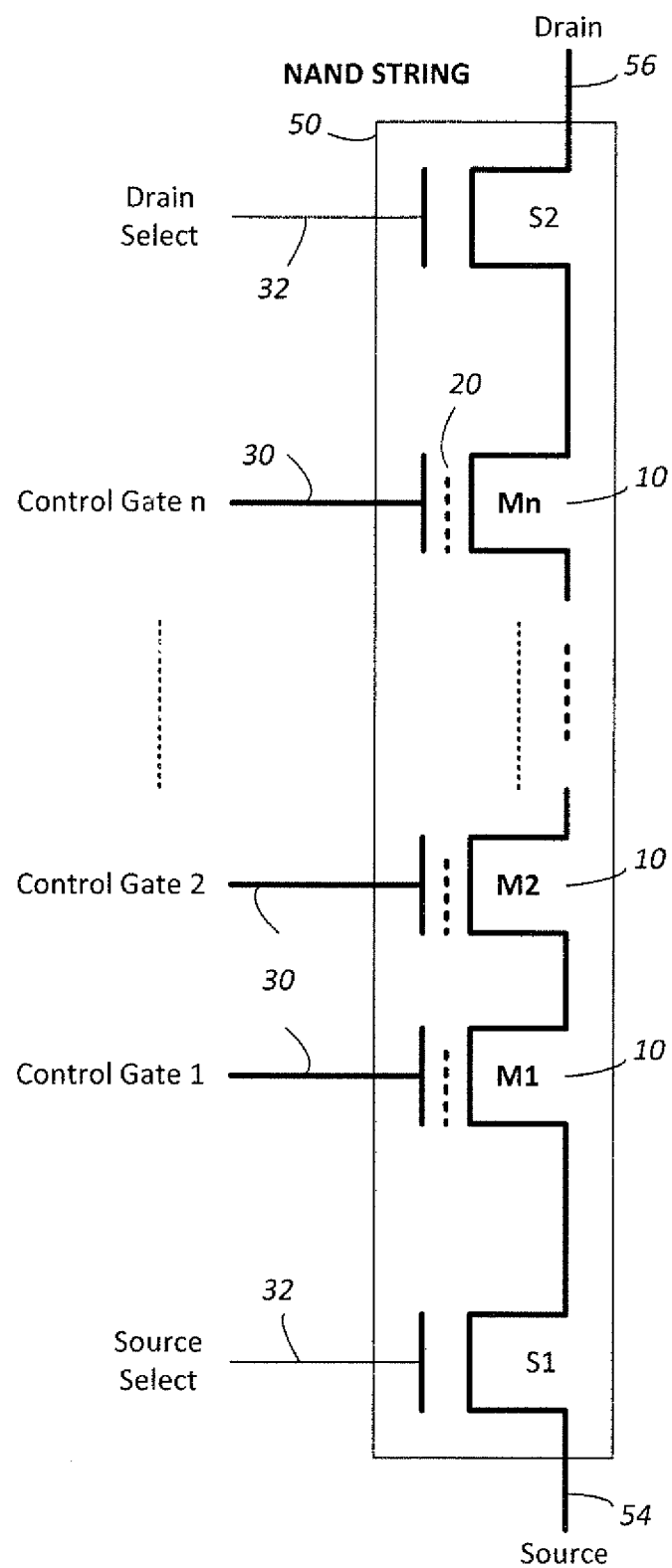
FIG. 4A shows an example of a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
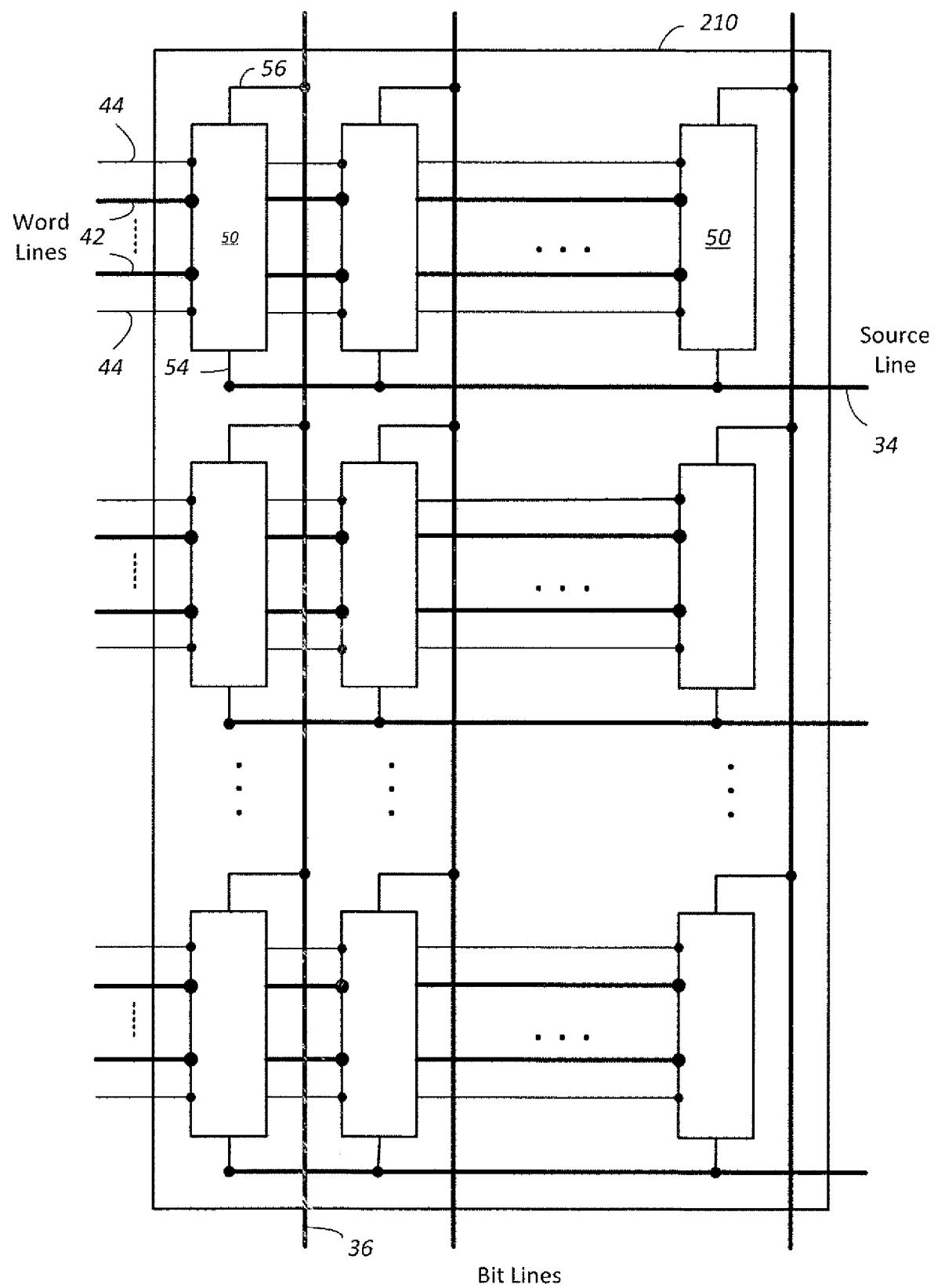
FIG. 4B shows an example of how NAND strings may be connected in a NAND flash memory array.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
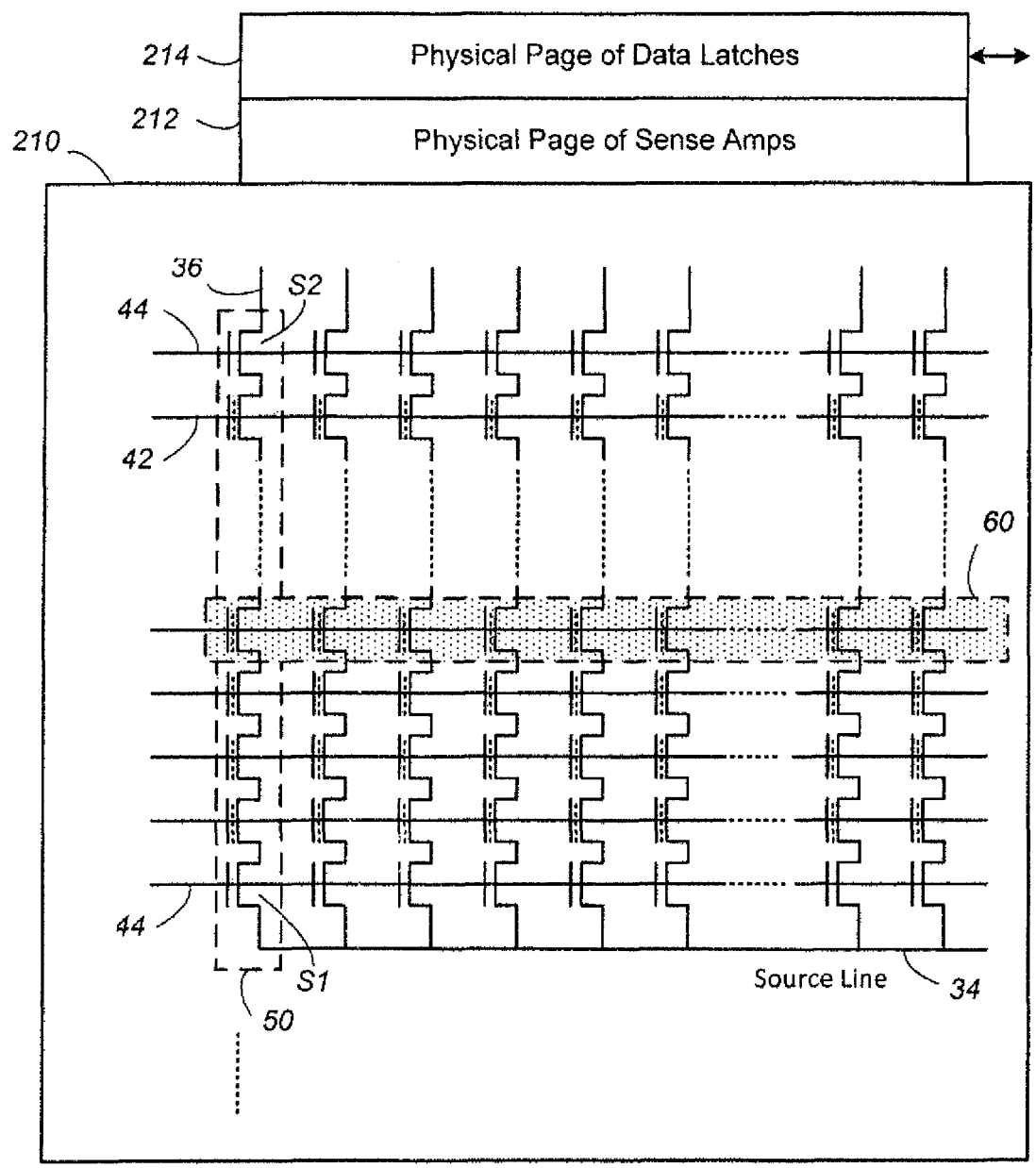
FIG. 5 shows a page of memory cells formed along a word line in a NAND flash memory array.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
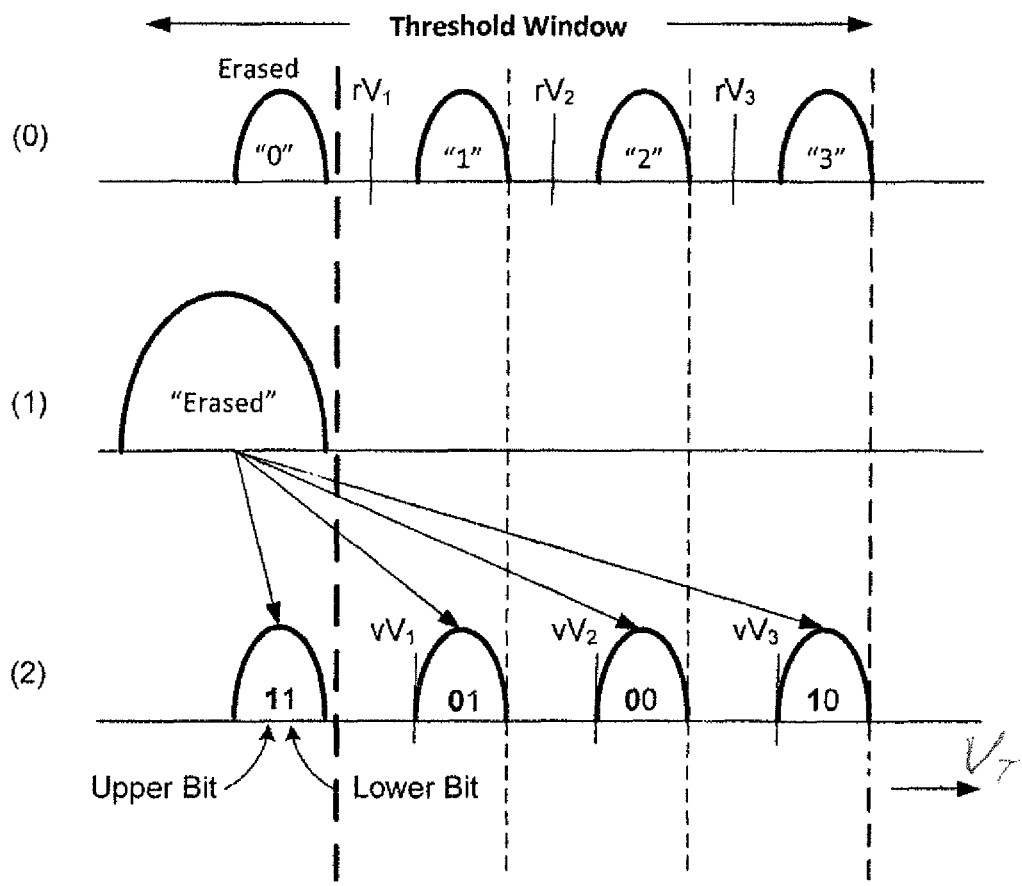
FIG. 6 illustrates programming flash memory cells.

FIGS. 6(0)-6(2) illustrate an example of programming a population of 4-state memory cells. FIG. 6(0) illustrates the population of memory cells programmable into four distinct distributions of threshold voltages ("$V_T$") respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
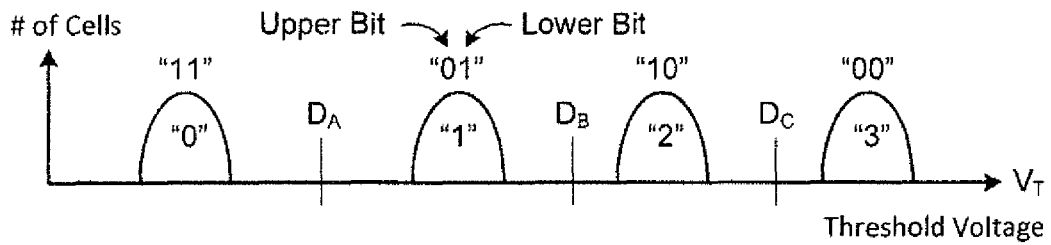
FIGS. 7A-7E illustrate programming and reading of flash memory cells using a 2-bit code.

FIGS. 7A-7E illustrate the programming and reading of the 4-state memory encoded with a given 2-bit code with threshold voltage ($V_T$) on the horizontal axis and the number of cells ("# of cells") on the vertical axis. FIG. 7A illustrates threshold voltage ($V_T$) distributions of the 4-state memory array when each memory cell stores two bits of data using the 2-bit code. Such a 2-bit code has been disclosed in U.S. Pat. No. 7,057,939.

Figure 7B:
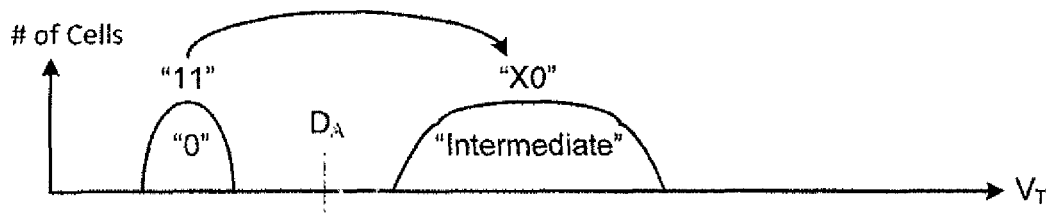

FIG. 7B illustrates the lower page programming (lower bit) in a 2-pass programming scheme using the 2-bit code. The fault-tolerant programming scheme in this example essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
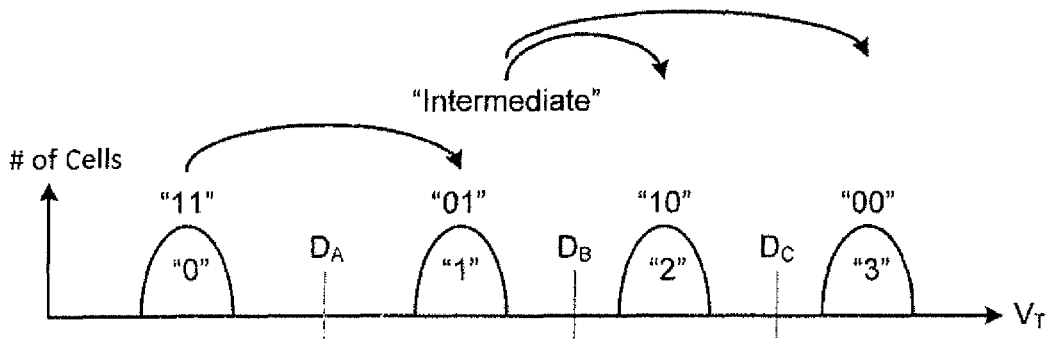

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
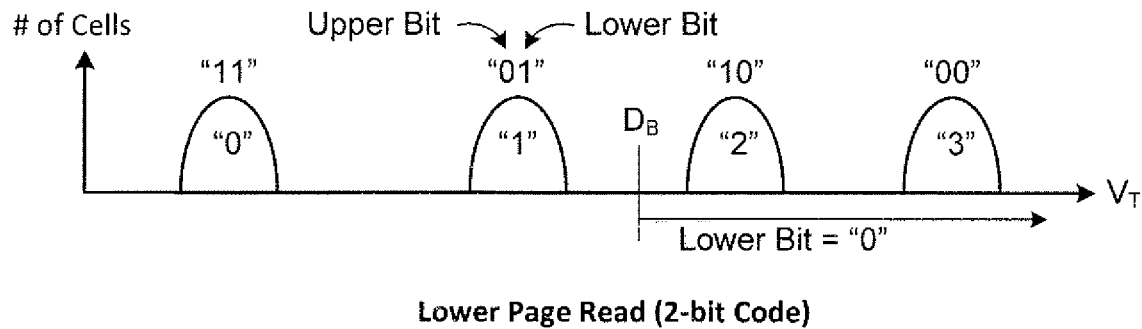

FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
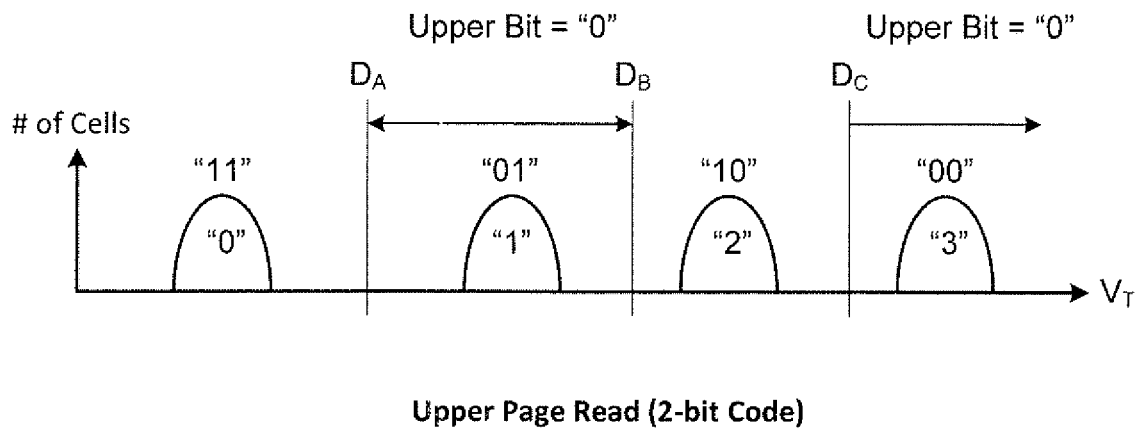

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page.

In principle, any page in a memory that is erased should have all of its cells in the erased state ("0" state in FIG. 7E, logically "11" state in FIG. 7E, in SLC memory: logically "1" state). However, in real memory systems, some cells may fail and there may be some maximum number of cells that may be permitted to be in a programmed state while still considering the page to be erased (typically, this is a small number so that any erroneous data resulting from such failed cells would be correctable by ECC).

In some cases, a write operation may commence on a particular memory page, but may be aborted for some reason (e.g. loss of power) before memory cells are fully programmed. The page may still be considered as erased by the memory system (e.g. memory controller may not have changed its status since programming was not complete). However, memory cells in such a page may have threshold voltages that are higher than the erased state. This may occur in either SLC or MLC memory.

In some cases, such partially-written page resulting from a write abort may be detected by simply reading the page using normal reading conditions. For example, as shown in FIG. 7E, where $D_A$ is the discrimination voltage between the erased state ("0" state) and the lowest programmed state ("A" or "1" state), the page may be read using $D_A$ and the number of programmed bits may be counted to see if a write abort may have occurred (more than a maximum permitted number would indicate a write abort has occurred).

While in many cases a conventional read may identify a page that has been subject to an aborted write operation, in some cases, a write abort may not be detectable in this manner. In such cases, the aborted programming operation has not proceeded sufficiently to program more than the minimum number of cells past the lowest discrimination voltage $D_A$. However, even though these cells still have threshold voltages that are close to the erased condition (and are read as being erased using discrimination voltage $D_A$) such partial programming may cause problems when data is written in the cells. Programming operations are designed to operate on pages of cells that are within a particular distribution resulting from an erase operation. Deviation from such a distribution may cause problems during programming. For example, if the memory attempts to store data in such a page, partially programmed cells may have their threshold voltages raised to a point where they are between memory states (e.g. between erased and lowest programmed state). This could make the programmed data unreadable.

Figure 8:
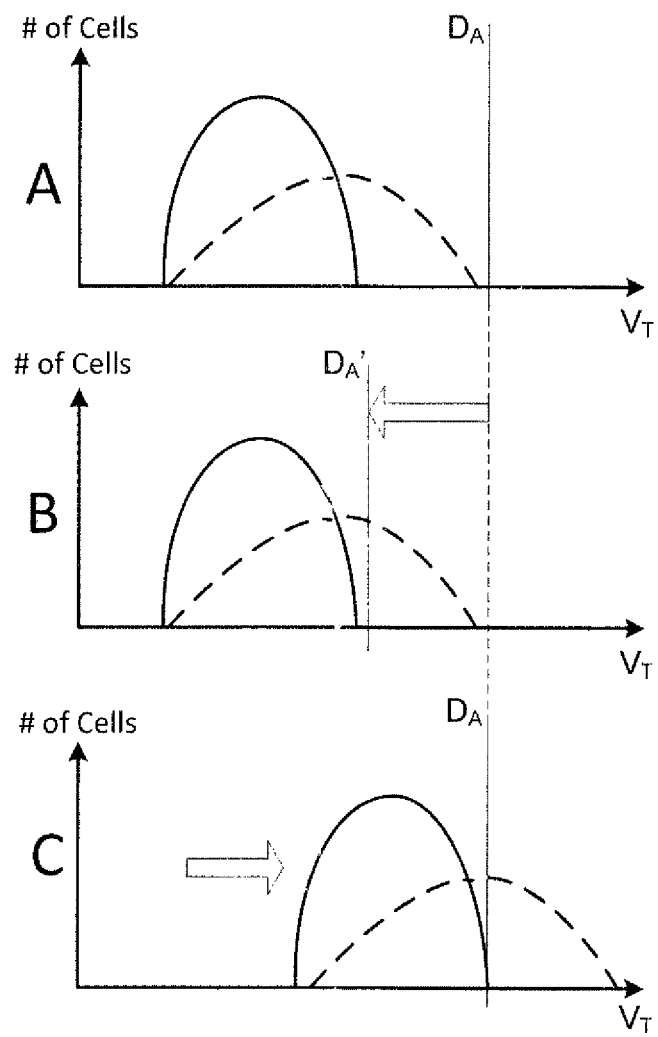
FIGS. 8A-8C illustrate how partial programming of memory cells may be detected.

FIG. 8A shows an example of how memory cells of a page can be partially programmed as a result of a write abort. An ideal distribution of threshold voltages of a page of erased memory cells is shown by the solid line, while the dashed line shows a distribution after a write abort (the vertical axis represents the number of cells, "# of cells" and the horizontal axis represents threshold voltage "$V_T$"). It can be seen that even though the threshold voltages have been raised, they remain below $D_A$ and thus would not be detectable using a normal read with control gate voltage $D_A$. Even though such a distribution shows threshold voltages below $D_A$, such modified threshold voltages are still problematic. In particular, attempting to write data into such a page may cause such data to be unreadable because the cells are not in the expected erased condition.

One way to determine if memory cells that should be in an erased condition are, in fact, partially programmed, is to apply a modified read voltage. In particular, the read voltage may be lowered so that the memory cells that are partially programmed, which have threshold voltages indicated by the dashed line, are identified. FIG. 8B illustrates such a lowering of voltage from $D_A$ to $D_A'$. Reading the memory cells using control gate voltage $D_A'$ gives a large number of cells in a programmed state which indicates that a write abort has occurred.

While using a reduced read voltage may be sufficient to identify write abort conditions in some memory arrays, there may be limitations on this technique in some memory arrays. In particular, it may be necessary to apply a negative read voltage in order to identify write abort conditions in some memory arrays (i.e. even reading with a read voltage=0 volts may not adequately identify programmed cells). However, such negative read voltages may not be available in some memory systems. Modifying hardware to allow negative read voltages may be cost prohibitive and add unwanted complexity. Accordingly, this technique is not ideal for all memory circuits.

FIG. 8C shows an alternative technique for identifying when a page of memory cells have been affected by a write abort. In this case, rather than shift the control gate voltage down (in some cases requiring a negative control gate voltage), here the threshold voltages of the page of memory cells are moved up so that a conventional read voltage may be used. This read voltage may be a positive voltage, or may be zero volts, thus avoiding the need for hardware changes associated with negative read voltages.

Threshold voltages of a page of memory cells may be shifted up by modifying one or more voltages applied to neighboring word lines. In particular, neighboring word lines that are biased to a particular voltage, Vpass, during a normal read operation, may be biased to a different voltage in order to raise the threshold voltages of memory cells along the word line that is being read.

Figures 9, 10:
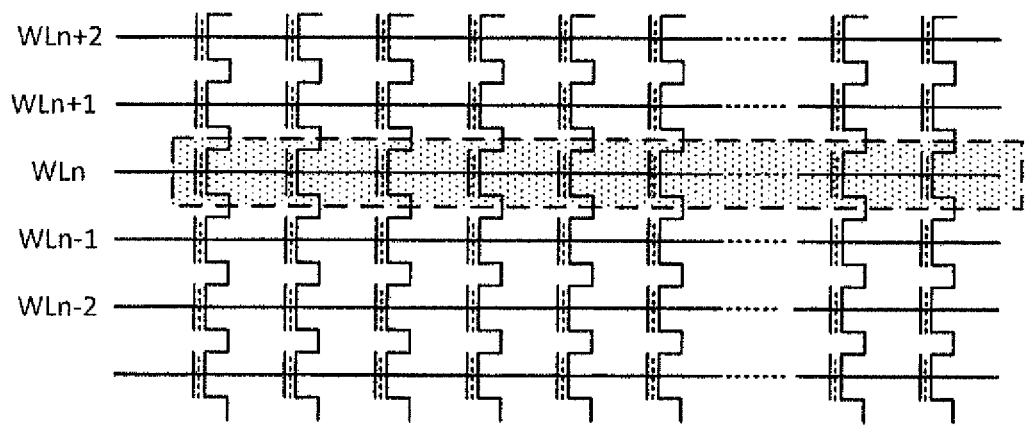
FIG. 9 shows a selected word line WLn and its neighbors.
FIG. 10 shows voltages applied to word lines of FIG. 9 during normal read and negative Vth read conditions.

FIG. 9 shows a portion of a NAND flash memory array including a word line, WLn, which is being checked to see if a write abort may have occurred. In general, when cells of a particular word line are being read, other word lines are biased to a voltage, Vpass, which turns the underlying memory cells "on" and thus makes the NAND strings conductive above and below the word line being read. Vpass may be a single uniform voltage that is applied to all word lines above and below the word line being read. In some cases a different Vpass may be applied to word lines of cells that are already written and to word lines that have not yet been written. In order to perform a normal read on WLn, voltage Vpass is applied to word lines on either side of WLn, i.e. to WLn+1, WLn+2, and so on, and to WLn-1, WLn-2 and so on. Thus, the read scheme described above with respect to FIGS. 7A-7E includes applying Vpass on word lines on either side of the word line being read.

When a page of memory cells is suspected of being affected by a write abort, the memory system may attempt to determine if there are more than a maximum number of programmed memory cells. Initially, the memory system may perform a normal read using a discrimination voltage, $D_A$, as described before. Voltage $D_A$ may be a low positive voltage, or may be zero. Alternatively, if $D_A$ is greater than zero, then a modified read voltage of zero may be used so that greater sensitivity to programmed cells is achieved (i.e. cells with threshold voltage greater than zero are detected, instead of requiring some higher threshold voltage). If a significant number of cells (more than a predetermined number) are read as programmed using such normal read conditions, then the page is partially programmed and cannot be used to store additional data without an erase.

If a read operation using normal read conditions does not indicate that the page contains partially programmed cells, then a further read may be performed using different read conditions that increase the threshold voltages of the cells being read. In particular, one or more neighboring word line voltages may be modified from Vpass in order to raise threshold voltages of memory cells along the word line being read. Thus, for example, if WLn is read using normal read conditions (Vpass applied to WLn+1, WLn-1, WLn+2, WLn-2, etc.) and does not appear to have partially programmed cells, another read operation may be performed on WLn under modified read conditions. In this example, the voltage applied to WLn+1 is modified by reducing it from Vpass by an amount Vdelta to a voltage Vpass-Vdelta.

The value of Vdelta determines the change in threshold voltage in a manner that depends on the memory design so that Vdelta may be chosen based on the memory design in question. In one example, Vpass is has a range of approximately 8-10 volts (e.g. 9 volts), while Vdelta is 5 volts or more, so that Vpass-Vdelta is less than 5 volts. There may be an upper limit on Vdelta (a lower limit on Vpass-Vdelta) because there has to be a sufficient voltage applied to all word lines to turn on underlying memory cells. In general, a value of Vpass may be chosen to move cell threshold voltages as shown in FIG. 8C, to a point where the upper end of the erased cell distribution is close to the control gate voltage used, and thus where any cells programmed above this distribution may be detected.

While a sufficient increase in threshold voltage may be provided by a single neighboring word line, in other cases the voltages applied to other neighboring word lines may also be modified in a manner that increases threshold voltage along the word line being read. For example, a modified voltage could be applied to WLn-1 in addition to the modified voltage applied to WLn+1. Thus, coupling can be achieved from both sides to increase threshold voltage. Other word lines such as WLn+2, or WLn-2 may also have modified voltages applied although these word lines are less coupled to WLn than the immediate neighbors WLn+1 and WLn-1 and may have less effect.

In the present example, the numbering of the word lines indicates the order in which the memory cells within a particular block are programmed. In this case, because WLn is apparently erased (though a write abort is suspected), it will generally be the case that WLn+1 and higher are erased (not yet written) while WLn-1 and lower are written. WLn may be indicated by a write pointer, or otherwise, as the next unwritten page. Thus, applying a modified voltage to WLn+1, which probably has no data in its cells, may have a lower risk than applying a modified voltage to WLn-1, which probably has data written in its cells. In other memory designs where data is written in a different order such assumptions may not apply and biasing may be done from either side.

FIG. 10 is a table showing conditions applied during a normal read and during a negative threshold voltage read ("Negative $V_{TH}$ Read Conditions"). In this example, only WLn+1 has its voltage modified, by an amount Vdelta (i.e., Vpass-Vdelta), in order to read negative threshold voltage cells. However, as described above, other word lines such as WLn-1 may also be modified in some cases. Biases applied to other components, such as a common source line, may be the same for both a normal read and a negative threshold voltage read, or may be modified.

Figure 11:
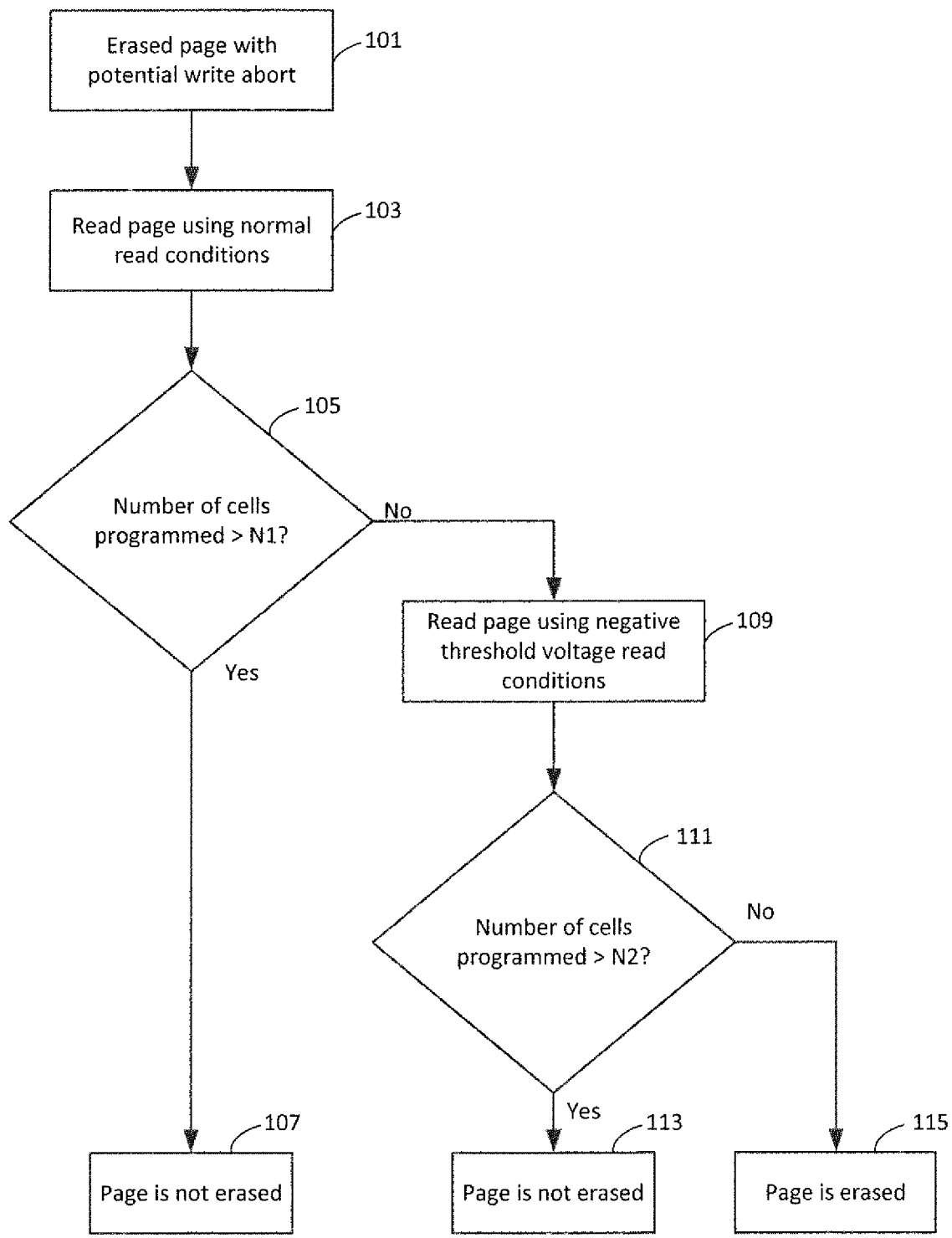
FIG. 11 shows a scheme for identifying memory cells that may be partially programmed.

FIG. 11 is a flowchart showing how a memory system may determine whether a memory page has partially programmed cells, even where those cells are not detectable using normal read conditions. Initially, a page is identified as potentially being partially programmed by an aborted write operation 101. For example, upon powering up, a memory system may look at write pointers or other indicators to determine which pages would have been affected by any aborted write. Such pages may then be read using normal read conditions 103. The number of cells that are programmed is then compared with a predetermined number 105. If the number of cells that are read as programmed (threshold voltage above $D_A$) exceeds a predetermined number, N1, then the page is not erased 107, and cannot be used to store data until it has been erased. At this point, the page may be marked in some way so that no data is stored in it.

If a read of the memory cells using normal read conditions does not indicate that more than a predetermined number of cells are programmed, then another read operation is performed 109 under particular conditions that are applied to raise the threshold voltages of memory cells and thus allow the memory system to read the memory cells using a positive, or zero, read voltage, even though they have negative threshold voltages under normal read conditions.

Negative threshold voltage read conditions may be applied as described above. In particular, at least one neighboring word line may have a voltage applied that is lower than Vpass by a predetermined amount Vdelta. The number of cells that are read as programmed under these conditions is compared with a predetermined number N2 (which may be the same as N1, or may be different) 111. If the number of programmed cells exceeds N2 then the page is not erased 113 and should not be used for storing data. If the number of programmed cells is not greater than N2 then the page is erased 115 and can be used to store data.

While the above described scheme uses a conventional read initially, then a negative threshold voltage read, in other schemes a negative threshold voltage read may be used initially, without a preceding conventional read, when a write abort is suspected. The negative threshold voltage read may be carried out using the same value for control gate voltage, $D_A$, which is used in a conventional read, or may use a reduced voltage. Other parameters, such as source bias, may be maintained at the same level as a conventional read, or may be modified for a negative threshold voltage read. Aspects of the present invention may be applied to any portion of a memory array which contains memory cells with negative threshold voltages when read using a conventional read. This includes NAND flash memory cells, including both SLC and MLC memory cells.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method of determining whether a page of NAND flash memory cells is in an erased condition comprising:
    applying a first set of read conditions to identify a first number of cells having threshold voltages above a discrimination voltage under the first set of read conditions;
    if the first number of cells is less than a first predetermined number, applying a second set of read conditions that is different from the first set of read conditions to identify a second number of cells having threshold voltages above the discrimination voltage under the second set of read conditions; and
    if the second number of cells exceeds a second predetermined number, marking the page of flash memory cells as partially programmed.

2. The method of claim 1 wherein the first set of read conditions includes a uniform word line bias to all unselected word lines in a block containing the page of NAND flash memory cells.

3. The method of claim 2 wherein the second set of read conditions includes applying a reduced word line bias to an unselected word line adjacent to the selected word line, and applying the uniform word line bias to all other unselected word lines in the block.

4. The method of claim 3 wherein all cells along the unselected word line adjacent to the selected word line are unwritten cells.

5. The method of claim 3 wherein the uniform word line bias of the first set of read conditions is 8-10 volts and the reduced word line bias to the unselected word line in the second set of read conditions is less than 5 volts.

6. The method of claim 5 wherein the discrimination voltage is 0 volts and the discrimination voltage is applied to the selected word line.

7. The method of claim 2 wherein the second set of read conditions includes applying a reduced word line bias to two unselected word lines that are adjacent to the selected word line on either side, and applying the uniform word line bias to all other unselected word lines in the block.

8. The method of claim 2 wherein the second set of read conditions includes applying a reduced word line bias to three or more unselected word lines while applying the uniform word line bias to all other unselected word lines in the block.

9. The method of claim 1 further comprising, if the first number of cells is greater than the first predetermined number, marking the page of flash memory as partially programmed.

* * * * *